(12) United States Patent
Genrich

(10) Patent No.: US 6,298,093 B1
(45) Date of Patent: Oct. 2, 2001

(54) APPARATUS AND METHOD FOR PHASE AND FREQUENCY DIGITAL MODULATION

(75) Inventor: Thad J. Genrich, Arapahoe, CO (US)

(73) Assignee: Raytheon Company, Lexington, MA (US)

( * ) Notice: Subject to any disclaimer, the term of this patent is extended or adjusted under 35 U.S.C. 154(b) by 0 days.

(21) Appl. No.: 09/369,484

(22) Filed: Aug. 5, 1999

(51) Int. Cl.[7] ............................................... H03K 7/06
(52) U.S. Cl. ........................ 375/271; 375/302; 375/306; 332/144; 332/161; 455/110; 455/118
(58) Field of Search ................................. 375/271, 272, 375/279, 302, 306, 308; 455/110, 112, 118; 332/127, 144, 159, 161

(56) References Cited

U.S. PATENT DOCUMENTS

| | | | |
|---|---|---|---|
| 4,787,058 | 11/1988 | Schmars | 364/807 |
| 4,926,443 | 5/1990 | Reich | 375/102 |
| 5,027,087 | 6/1991 | Rottinghaus | 332/127 |
| 5,111,162 | * 5/1992 | Hietala et al. | 332/127 |
| 5,249,204 | 9/1993 | Funderburk et al. | 375/97 |
| 5,315,620 | 5/1994 | Halawani et al. | 375/102 |
| 5,483,203 | 1/1996 | Rottinghaus | 331/10 |
| 5,596,609 | 1/1997 | Genrich et al. | 375/350 |
| 5,697,068 | 12/1997 | Salvi et al. | 455/76 |
| 5,790,601 | * 8/1998 | Corrigan, III et al. | 375/302 |
| 5,894,592 | * 4/1999 | Brueske et al. | 455/86 |
| 5,991,605 | * 10/2000 | Rapeli | 455/76 |
| 6,028,493 | * 2/2000 | Olgaard et al. | 332/103 |
| 6,133,804 | * 10/2000 | Wagner et al. | 332/127 |

FOREIGN PATENT DOCUMENTS

| | | | |
|---|---|---|---|
| 196 16 368 C1 | 12/1997 | (DE) | H03D/3/02 |
| 0 392 229 A2 | 3/1992 | (EP) | H04L/25/06 |
| 0 889 595 A1 | 1/1999 | (EP) | H03L/7/18 |

OTHER PUBLICATIONS

Aschwanden, Felix, Manscript, "Direct Conversion—How to Make it Work in TV Tuners", Laboratories RCA Ltd., Badenestrasse 569, CH 8048, Zurich, Switzerland, IEEE Transactions on Consumer Electronics, vol. 42, No. 3, Aug. 1996, pp. 729–738.

PCT International Search Report dated Nov. 10, 2000 for PCT/US 00/20060 filed Jul. 21, 2000.

Hogenauer, Eugene B., Manuscript: "An Economical Class of Digital Filters for Decimation and Interpolation", IEEE Transactions on Acoustics, Speech and Signal Processing, vol. ASSP–29, No. 2, Apr. 1981, 9 pages.

PCT International Search Report dated Nov. 15, 2000 for PCT/US 00/21016 filed Aug. 1, 2000.

* cited by examiner

Primary Examiner—Stephen Chin
Assistant Examiner—Dac V. Ha
(74) Attorney, Agent, or Firm—Baker Botts L.L.P.

(57) ABSTRACT

Apparatus for phase/frequency digital modulation includes a digital circuit receiving and processing a digital modulation input signal to generate a digital modulation control signal, a digital-to-analog converter coupled to the digital circuit converts the digital modulation control signal into an analog modulation control signal, and an RF/analog circuit is coupled to the digital-to-analog converter. The RF/analog circuit includes a voltage controlled oscillator to generate a modulated output signal in response to the analog modulation control signal, and a quadrature tuner coupled to the voltage controlled oscillator generates an in-phase tuner output and a quadrature tuner output in response to the modulated output signal. An analog-to-digital converter is coupled to the quadrature tuner and converts the in-phase tuner output and the quadrature tuner output to digital in-phase and quadrature tuner outputs. The digital in-phase tuner output and the quadrature tuner output are fed back to the digital circuit to generate the digital modulation control signal.

42 Claims, 6 Drawing Sheets

APPARATUS AND METHOD FOR PHASE AND FREQUENCY DIGITAL MODULATION

TECHNICAL FIELD OF THE INVENTION

This invention is related in general to signal modulation, and more particularly, to apparatus and method for phase and frequency digital modulation.

BACKGROUND OF THE INVENTION

The typical digital phase and frequency modulator (PM/FM) suffers from one or more inherent performance and/or implementation limitations. One conventional approach for digital phase and frequency modulation first generates a relatively low frequency modulated signal using a low to moderate sample rate digital to analog converter (DAC) and an anti-aliasing filter. The resulting signal is then up-converted to the desired output frequency using one or more frequency translation circuits. The disadvantages of this approach are the complexity of the frequency translation circuit implementation using mixers and filters, isolation and bandwidth limitations associated with frequency translation filtering, and the presence of mixing spurious signals at the final output.

Another similar conventional implementation generates quadrature low frequency modulated signals using two digital-to-analog converters and anti-aliasing filters with a low to moderate sample rate. These signals are used to control a quadrature modulator, which directly produces the modulated output centered at the frequency of its local oscillator input. This approach provides lower complexity and wider output bandwidth capabilities than the up-conversion approach. However, the major disadvantage of this approach is that it produces distortions due to amplitude and phase imbalances which are unacceptable in many applications.

A third conventional approach uses an undersampling (or bandpass sampling) technique with a digital-to-analog converter with a moderate to high sample rate. The output signal is a sampling image which is a sum or difference of the fundamental digital-to-analog converter output frequency and a harmonic of the sampling frequency. The image is selected from all of the other images present at the digital-to-analog converter output with a bandpass filter. This approach has bandwidth limitations due to the output filtering, and dynamic range (signal-to-noise ratio) limitations of the digital-to-analog converter at output frequencies above its sample rate.

A fourth conventional implementation utilizes a very high speed digital-to-analog converter which oversamples the desired output frequency. This approach avoids the frequency conversion and filtering limitations of the other aforementioned implementations. However, spurious signals are present in the output of this implementation due to the limited resolution of the high speed digital-to-analog converter. The high levels of the spurious signals are unacceptable in many applications. The circuitry required to generate the high speed digital-to-analog converter data inputs also generally has much higher complexity and power consumption than the other approaches.

SUMMARY OF THE INVENTION

It has been recognized that it is desirable to provide apparatus and method for phase and frequency digital modulation which avoids the problems and disadvantages of conventional circuits.

In one embodiment of the invention, apparatus for phase/frequency digital modulation includes a digital circuit receiving and processing a digital modulation input signal to generate a digital modulation control signal, a digital-to-analog converter coupled to the digital circuit operable to convert the digital modulation control signal into an analog modulation control signal, and an RF/analog circuit coupled to the digital-to-analog converter. The RF/analog circuit includes a voltage controlled oscillator operable to generate a modulated output signal in response to the analog modulation control signal, and a quadrature tuner coupled to the voltage controlled oscillator operable to generate an in-phase tuner output and a quadrature tuner output in response to the modulated output signal. An analog-to-digital converter is coupled to the quadrature tuner and operable to convert the in-phase and quadrature tuner outputs to digital in-phase and quadrature tuner outputs. The digital in-phase and quadrature tuner outputs are fed back to the digital circuit to generate the digital modulation control signal.

In another embodiment of the invention, apparatus for phase/frequency digital modulation includes a programmable logic digital circuit receiving a modulation input signal and operable to generate a modulation control signal therefrom, and an RF/analog circuit coupled to the programmable logic digital circuit and receiving the modulation control signal. The RF/analog circuit includes a voltage controlled oscillator operable to generate a modulated output signal in response to the modulation control signal, and a quadrature tuner coupled to the voltage controlled oscillator operable to generate an in-phase tuner output and a quadrature tuner output in response to the modulation control signal. The in-phase and quadrature tuner outputs are fed back to the programmable logic digital circuit to generate the modulation control signal.

In yet another embodiment of the invention, a method for phase/frequency digital modulation includes the steps of receiving a modulation input signal and at least one feedback signal and generating a modulation control signal therefrom, using the modulation control signal to control a voltage controlled oscillator and generating a modulated output signal, generating an in-phase and a quadrature tuner outputs in response to the modulated output signal, and generating the at least one feedback signal from the in-phase and quadrature tuner outputs.

One technical advantage of the invention is that the use of the voltage controlled oscillator and quadrature feedback avoids the problems of frequency translation, digital-to-analog converter spurious and dynamic range, and high speed digital-to-analog converter drive circuitry complexity and power consumption. Another technical advantage of the invention is that identical RF/analog circuits enables the implementation of the digital circuit with programmable logic devices that can be configured.

BRIEF DESCRIPTION OF THE DRAWINGS

For a better understanding of the present invention, reference may be made to the accompanying drawings, in which.

DETAILED DESCRIPTION OF THE INVENTION

Figure 1:
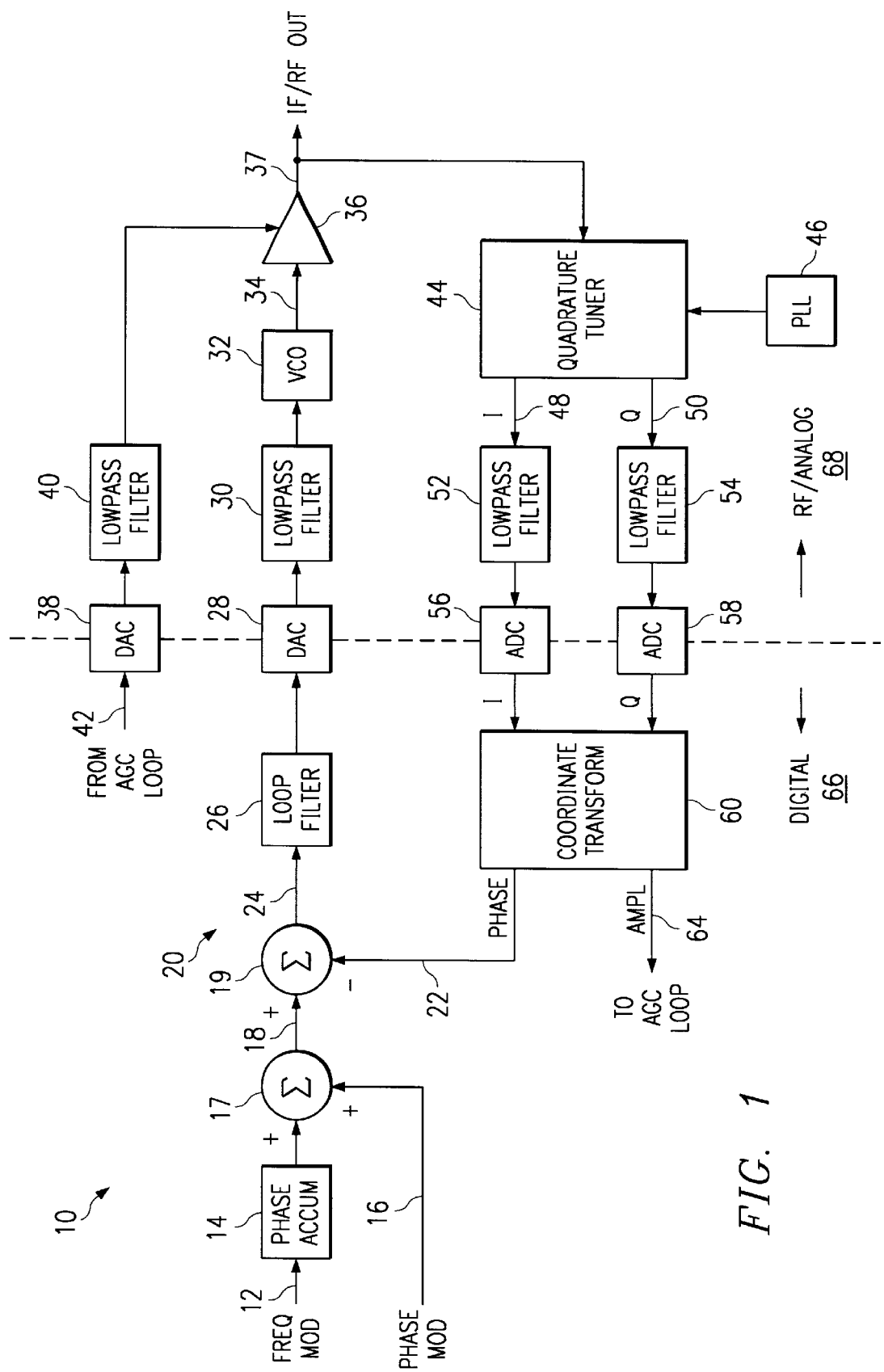
FIG. 1 is a block diagram of an embodiment of a narrowband phase and frequency digital modulator constructed according to the teachings of the present invention.

The preferred embodiments of the present invention are illustrated in FIGS. 1–11, where like reference numerals are used to refer to like and corresponding parts or portions of the invention.

It is important to note that certain circuit components, circuit blocks, and devices forming portions of the digital modulators of the present invention described below are well known in the art of digital signal processing. Therefore, a detailed description of the well known circuit components, circuit blocks, and devices is not required. It may also be worthwhile to note that the digital modulators of the present invention are described in the context of both algorithms and functional circuit blocks for implementing the algorithms. Therefore, the present invention anticipates any circuit designs that implement the algorithms shown in the figures and described below.

Figure 2:
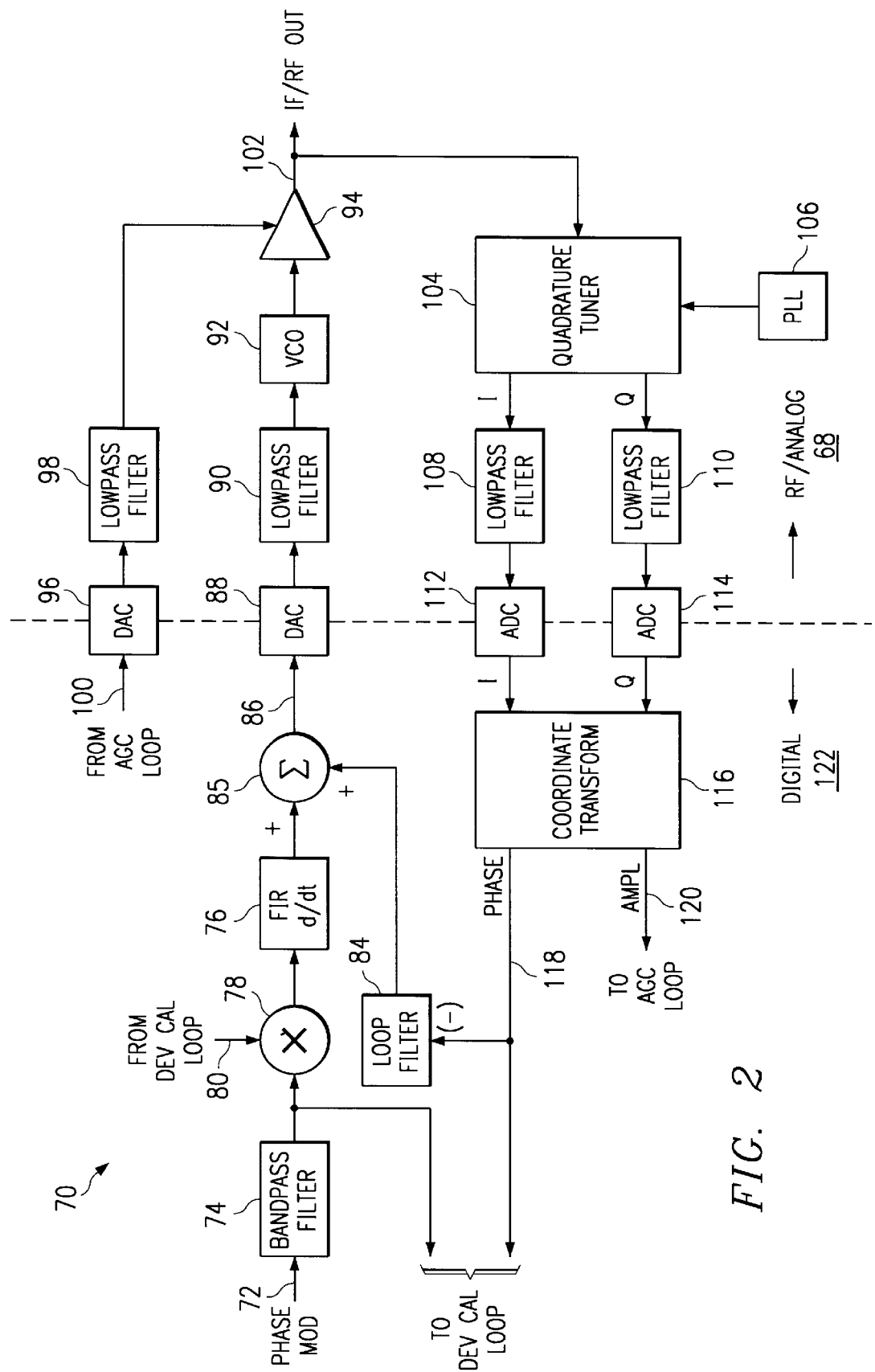
FIG. 2 is a block diagram of an embodiment of a wideband phase digital modulator constructed according to the teachings of the present invention.
Figure 3:
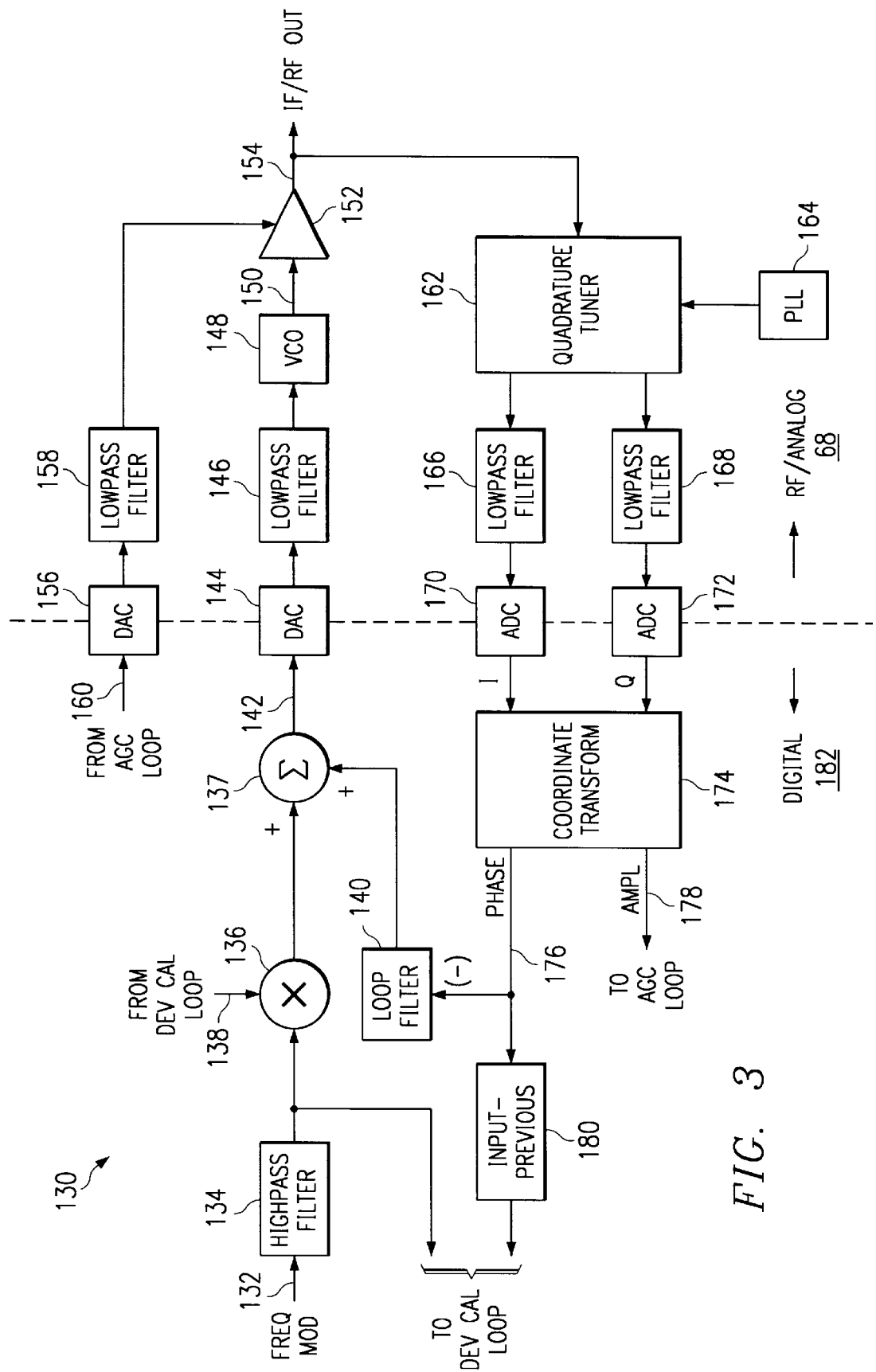
FIG. 3 is a block diagram of an embodiment of a wideband frequency digital modulator constructed according to the teachings of the present invention.
Figure 6:
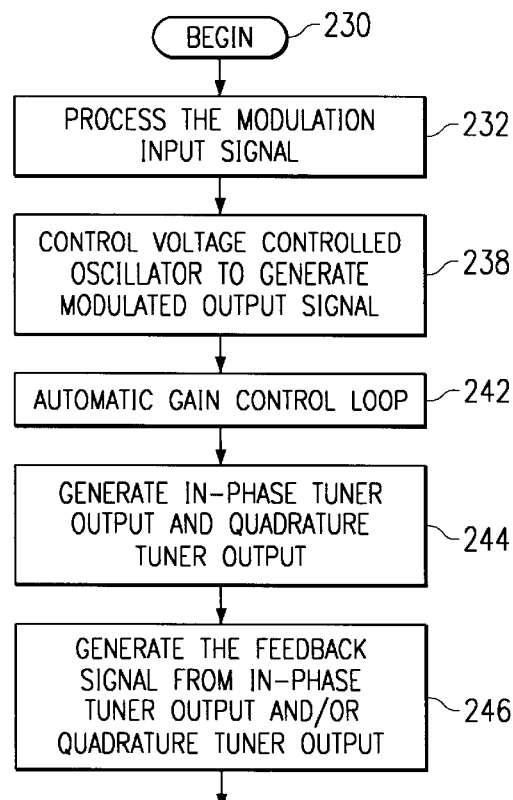
FIG. 6 is a flowchart of an embodiment of a method for common phase and/or frequency digital modulation according to the teachings of the present invention.

Referring to block diagrams shown in FIGS. 1–3, it may be seen that narrowband phase and frequency modulator 10 (FIG. 1), wideband phase modulator 70 (FIG. 2), and wideband frequency modulator 130 (FIG. 3) each has a digital circuit portion (66, 122, 182) and a common RF/analog circuit portion 68. In general, the common phase or frequency modulator process is shown in FIG. 6, which begins in block 230. The modulation input signal is first processed in some manner by the digital portion of the modulators, as shown in block 232. Thereafter, the processed signal is used to control a voltage controlled oscillator to generate a modulated output signal, as shown in block 238. An automatic gain control loop or process is then used to generate an output to drive an automatic gain control amplifier receiving the modulated output signal, as shown in block 242. In block 244, in-phase tuner output and quadrature tuner output are generated from the output of the automatic gain control amplifier. A feedback signal is then generated from the in-phase tuner output and/or the quadrature tuner outputs, as shown in block 246. The process ends in block 248. The process described above is relevant to each of the modulation methods described below.

Figures 7, 8:
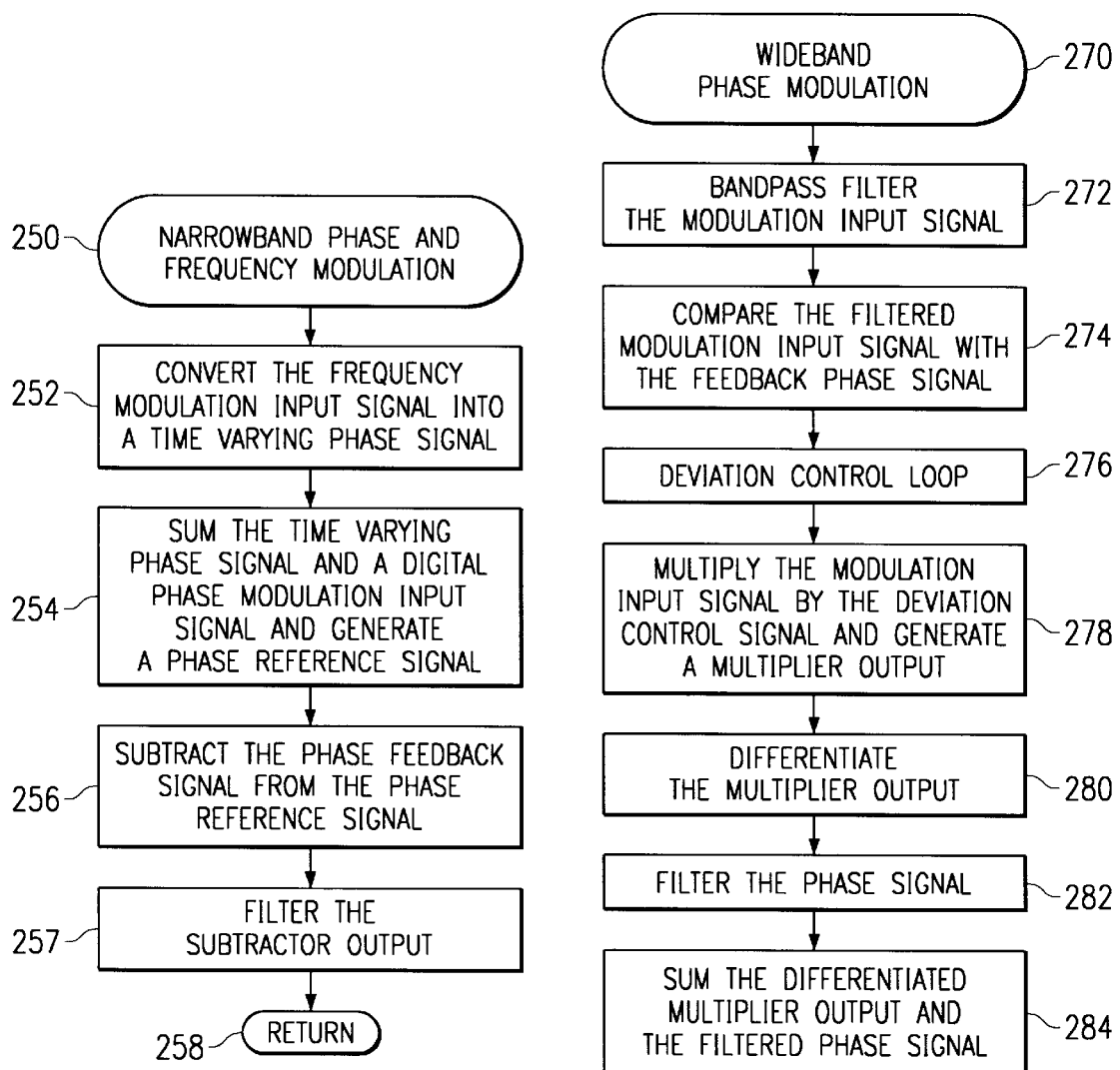
FIG. 7 is a flowchart of an embodiment of a method for processing the modulation input signal for narrowband phase and frequency digital modulation according to the teachings of the present invention.
FIG. 8 is a flowchart of an embodiment of a method for processing the modulation input signal for wideband phase digital modulation according to the teachings of the present invention.

A block diagram of an embodiment of a narrowband phase and frequency digital modulator 10 constructed according to the teachings of the present invention is shown in FIG. 1. Referring also to FIG. 7 for a flowchart of the exemplary method for narrowband phase and frequency digital modulation, which begins in block 250. A digital frequency modulation input word 12 is processed by supplying it to a phase accumulator 14, which converts input word 12 into a time varying phase representation (block 252). The output from phase accumulator 14 is summed, by a summer 17, with a digital phase modulation input word 16 to generate a phase reference signal 18 for a modulator phase-locked loop (PLL) 20 (block 254). Phase reference signal 18 along with a feedback signal in the form of a phase signal 22 are provided to and received by a summer 19. Summer 19 subtracts phase signal 22 from phase reference signal 18 to form a phase error signal or a modulation control signal 24 (block 256) that is provided as an input to a loop filter 26. Loop filter 26 filters modulation control signal 24 (block 257). The digital portion of the process ends in block 258.

The output of loop filter 26 is a filtered modulation control signal coupled to a digital-to-analog converter (DAC) 28 followed by an anti-aliasing or low pass filter 30. The output from filter 30 drives a voltage controlled oscillator (VCO) 32 having a modulated intermediate frequency (IF) or radio frequency (RF) output 34 (FIG. 6, block 238). When phase-locked loop 20 is locked, modulated output 34 tracks the phase of phase reference signal 18, which is modulated by frequency and phase modulation input words 12 and 16. An automatic gain control (AGC) amplifier 36 coupled to voltage controlled oscillator 32 receives modulated output 34 therefrom and generates an output with an IF/RF output power kept at a constant level (block 242). Automatic gain control amplifier 36 is driven by an output from a digital-to-analog converter 38 and low pass filter 40 combination that is connected to an output 42 of an automatic gain control loop 200 (block 238 and FIG. 10) shown in FIG. 4, which is described below.

Modulated IF/RF output 37 from amplifier 36 is fed back to a quadrature tuner 44 whose center frequency is controlled by an IF/RF phase-locked loop 46. The in-phase (I) and quadrature (Q) outputs 48 and 50 of quadrature tuner 44 (block 244) are supplied to and filtered by low pass filters 52 and 54, respectively, to remove potential aliasing components. The filtered outputs from low pass filters 52 and 54 are converted to digital signals by dual analog-to-digital converters 56 and 58, respectively. The digital in-phase and quadrature signals are then provided to a coordinate transform 60, which converts the Cartesian (X, Y) in-phase and quadrature signals into polar (R, θ) amplitude and phase representations 22 and 64. Amplitude information 64 is sent to automatic gain control loop 200 (FIG. 4) for comparison with the desired level and filtering. Phase information 22 is supplied as a feedback signal to summer 19 to be subtracted from phase reference signal 18 to generate modulation control signal 24 (block 246).

Figure 4:
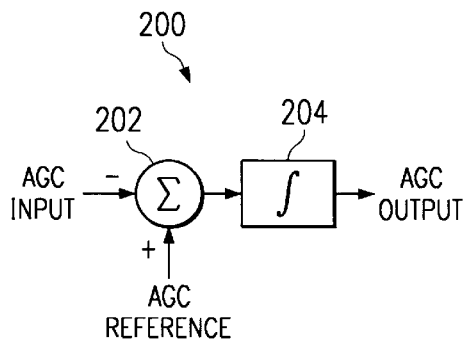
FIG. 4 is a block diagram of an embodiment of an automatic gain control circuit constructed according to the teachings of the present invention.
Figure 10:
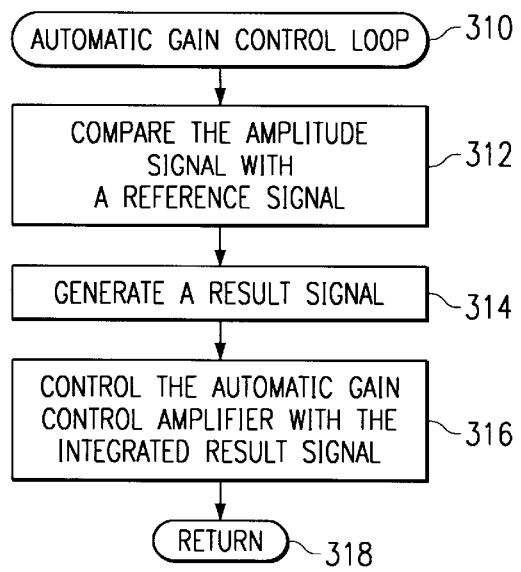
FIG. 10 is a flowchart of an embodiment of a method for automatic gain control loop for phase and frequency digital modulation according to the teachings of the present invention.

Referring to FIG. 4, an exemplary embodiment of an automatic gain control loop 200 is shown. FIG. 10 is a flowchart of an exemplary method for automatic gain control loop. Automatic gain control loop 200 includes a summer 202 for subtracting amplitude information (AGC input)

64 received from coordinate transform 60 (FIG. 1) from an automatic gain control reference signal. In effect, summer 202 obtains a difference or a comparison of amplitude information 64 and the automatic gain control reference signal (block 312) to generate a result signal (block 314). The automatic gain control reference signal may be a predetermined fixed signal or one generated by a known method or process executed by a microprocessor, computer, or other computing platforms. The output from summer 202 is supplied to an integrator 204. The output of integrator 204 or automatic gain control loop 200 is coupled to digital-to-analog converter 38 (FIG. 1), having an output that is low pass filtered and used to control automatic gain control amplifier 36 (block 316). The process then returns to block 244 in FIG. 6 (block 318).

In this manner, amplitude information 64 is used as a feedback signal for automatic gain control loop 200 and phase information 22 is used as a feedback signal for modulator phase-locked loop 20.

An advantage of the present invention is that modulation deviation is accurate, since it is directly controlled by a digital source.

Referring to FIG. 2, a block diagram of an embodiment of a wideband phase modulator 70 is shown according to the present invention. Reference is also made to flowcharts shown in FIGS. 6, 8, 10, and 11. The process begins in the flowchart shown in FIG. 6, with the flowchart shown in FIG. 8 supplying details on an embodiment of wideband phase digital modulation signal processing (block 270) according to the present invention. The flowcharts in FIGS. 10 and 11 supply details on automatic gain control and deviation signal generating processes, respectively.

Referring first to FIG. 6, the modulation input signal is received and processed (block 232) to remove noise and signals residing in certain frequencies, for example. A digital phase modulation input word 72 is supplied to a bandpass filter 74 (FIG. 8, block 272) having an input coupled to a multiplier 78. Low input frequencies are rejected by bandpass filter 74 to prevent interference with the operation of modulator 70. High frequencies which cannot be processed accurately by a finite impulse response (FIR) differentiator 76 coupled to the output of multiplier 78 are also rejected by bandpass filter 74. The bandpass filter output is also routed to a deviation calibration loop 210 (FIG. 5) or function 320 (FIG. 11), to be described. Deviation calibration loop 210 and function 320 essentially compare the filtered phase modulation input signal 72 and phase signal 118 generated by coordinate transform 116 (block 274) to generate a deviation control signal 80 (block 276). Deviation calibration multiplier 78 uses deviation control signal 80 to adjust the filtered phase modulation input signal to produce the required phase modulation peak deviation (block 278). The output of multiplier 78 is coupled to finite impulse response differentiator 76, which differentiates the multiplier output (block 280). The finite impulse response differentiator output is then summed with the output of a modulator loop filter 84 by a summer 85 (block 284). The input to modulator loop filter 84 is phase signal 118 from coordinate transform 116 (block 282). The process shown in FIG. 8 ends in block 286.

The processed phase modulation input signal and a feedback signal consisting of the filtered phase signal from loop filter 84 are received at summer 85 (block 234) to generate a modulation control signal 86 (block 236). Modulation control signal 86 is then converted into analog form by a digital-to-analog converter 88 and then filtered (block 237), by a lowpass filter 90, for example. The output from lowpass filter 90 is provided to a voltage controlled oscillator 92, which generates a modulated output signal (block 238). An automatic gain control amplifier 94 is coupled to voltage controlled oscillator 92 to keep the output power of the modulated output signal at a constant level. Automatic gain control amplifier 94 is driven by an output from a digital-to-analog converter 96 and lowpass filter 98 that are coupled to an output 100 of an automatic gain control loop 200 (block 240), an embodiment of which is shown in FIGS. 4 and 10 as described.

It may be seen that in operation, finite impulse response differentiator 76 produces a signal that is used to tune voltage controlled oscillator 92 to produce phase modulation. Finite impulse response differentiator 76 may also provide compensation to correct amplitude vs. frequency nonlinearities in digital-to-analog converter 88, lowpass filter 90, and/or voltage controlled oscillator 92.

IF/RF modulated output 102 from amplifier 94 is fed back to a quadrature tuner 104 whose center frequency is controlled by an IF/RF phase-locked loop 106 (block 244). The in-phase and quadrature outputs of quadrature tuner 104 are filtered to remove potential aliasing components by, for example, lowpass filters 108 and 110, respectively, and then converted to digital form by dual analog-to-digital converters 112 and 114, respectively (block 246). A coordinate transform 116 receives and converts the digital in-phase and quadrature signals into phase and amplitude representations 118 and 120 (block 246). Amplitude information 120 is provided to an automatic gain control loop (an embodiment 200 shown in FIG. 4) for comparison with the desired reference level and filtering.

Phase information 118 from coordinate transform 116 is provided to modulator phase-lock loop filter 84, the output of which is summed with the feed-forward modulation signal from finite impulse response differentiator 76. Phase information 118 is also provided to deviation calibration loop 210 (FIG. 5).

Figure 5:
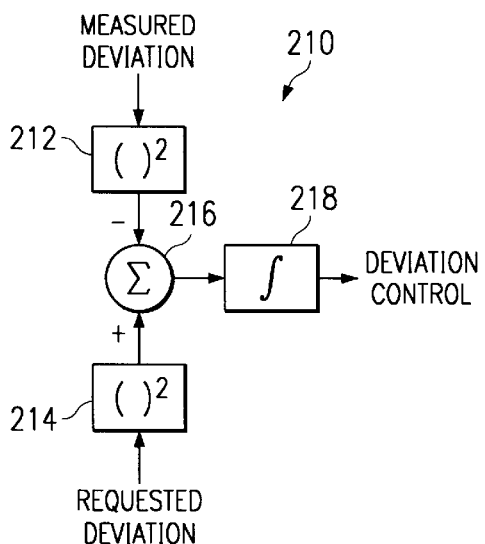
FIG. 5 is a block diagram of an embodiment of a deviation calibration circuit constructed according to the teachings of the present invention.
Figure 11:
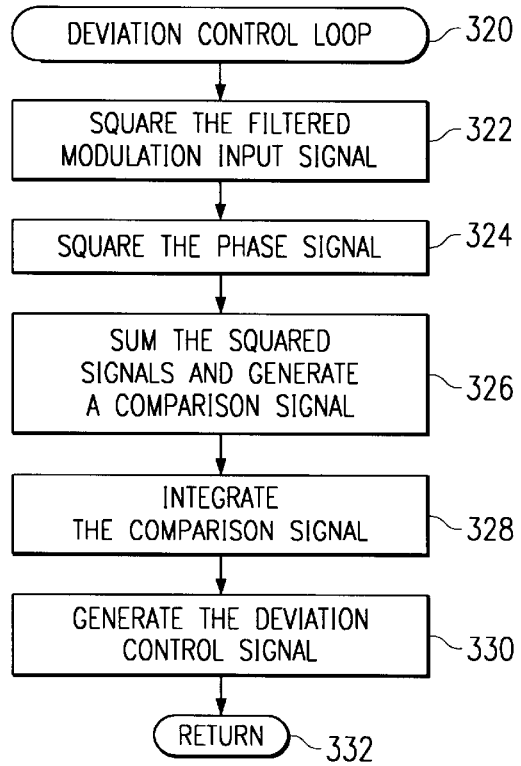
FIG. 11 is a flowchart of an embodiment of a method for generating a deviation control output signal for phase and frequency digital modulation according to the teachings of the present invention.

Referring to FIG. 5, an embodiment of a deviation calibration loop 210 is shown, and to FIG. 11, a flowchart of the process for generating a deviation output signal is shown. Deviation calibration loop 210 includes a squarer 212 receiving measured phase information 118 from coordinate transform 116 and a squarer 214 receiving the filtered phase modulation input signal from bandpass filter 74 (blocks 322 and 324). The squared values are supplied to a summer 216, which subtracts the squared measured phase information 118 from the squared filtered phase modulation input (block 326). The output from summer 216 is coupled to an integrator 218 (block 328), which generates a deviation control output (block 330). The process ends in block 332.

In operation, the mean square values of the measured phase information 118 and the filtered phase modulation input are compared. The comparison output is filtered by integrator 218, which generates a deviation control signal 80 that is supplied to multiplier 78 (FIG. 2).

Note that wideband PM modulator 70 may be divided into a digital portion 122 and the same RF/analog portion 68 as that of narrowband PM/FM modulator 10 shown in FIG. 1. Further, it may be noted that the RF/analog portions of modulators 10 and 70 are the same.

Figure 9:
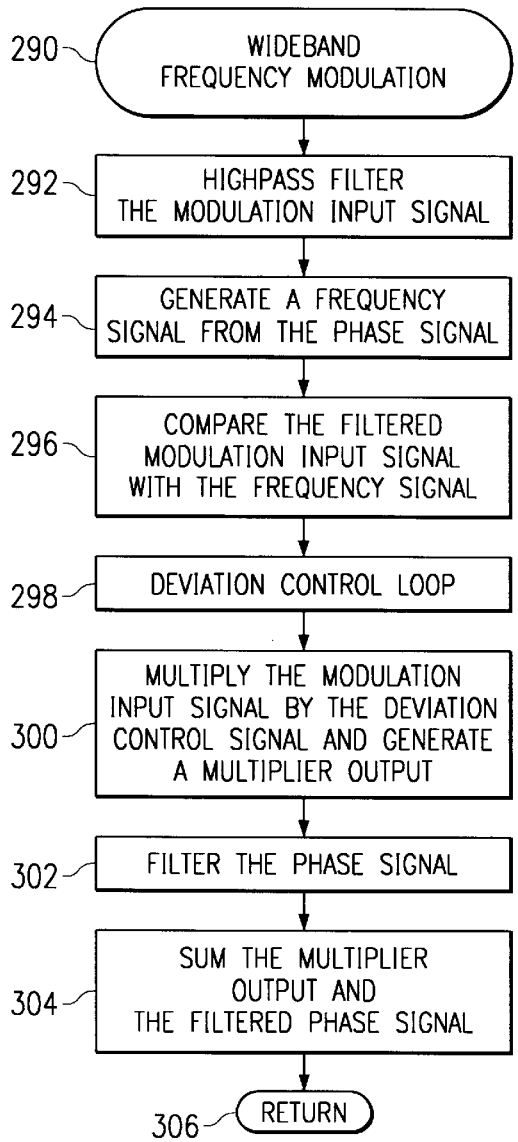
FIG. 9 is a flowchart of an embodiment of a method for processing the modulation input signal for wideband frequency digital modulation according to the teachings of the present invention.

A block diagram of an embodiment of a wideband frequency modulator 130 is shown in FIG. 3. Flowcharts of processes of frequency modulation are shown in FIGS. 6, 9, 10 and 11. FIG. 9, in particular, shows a flowchart of an embodiment of frequency modulation input signal processing 290. Referring to FIGS. 3 and 6, a frequency modulation input word 132 is received and processed (block 232) by filtering with a highpass filter 134 to eliminate low input frequencies which may interfere with the operation of modulator loop (FIG. 9, block 292). The highpass filter output is then routed to a requested deviation input of a deviation calibration loop 210, such as the one shown in FIG. 5 and described above. The deviation calibration process 320 is also shown in FIG. 11 and basically compares the filtered frequency modulation input signal with the frequency signal derived from the phase signal output from a coordinate transform 174 (block 296). The deviation calibration loop and process generate a deviation control signal 138 (block 298). A deviation calibration multiplier 136 uses deviation control signal 138 to adjust the filtered frequency modulation input signal from highpass filter 134 to produce the required frequency modulation peak deviation (block 300). The multiplier output is then provided to a summer 137, which sums it with the output from a modulator loop filter 140 to generate a modulation control signal 142 (blocks 302 and 304). Process 290 ends in block 306.

Modulation control signal 142 is converted into analog form by a digital-to-analog converter 144 and then provided to a lowpass filter 146 (FIG. 6, block 238). The lowpass filter output controls a voltage controlled oscillator 148, which generates a modulated output signal 150 (block 238). An automatic gain control amplifier 152 is coupled to the output of voltage controlled oscillator 148 to keep the output power of output signal 150 at a substantially constant level and generates a modulated output signal 154 therefrom. Automatic gain control amplifier 152 is driven by a digital-to-analog converter 156 coupled in series with a lowpass filter 158, which are in turn coupled to an output 160 of an automatic gain control loop (block 240), an embodiment is shown in FIG. 4. The automatic gain control process is also shown in FIG. 10.

IF/RF modulated output signal 154 is fed back to a quadrature tuner 162 whose center frequency is controlled by an JF/RF phase-locked loop 164 (block 244). The in-phase and quadrature outputs of quadrature tuner 162 are filtered by lowpass filters 166 and 168, respectively, to remove potential aliasing components, then converted to digital form by dual analog-to-digital converters 170 and 172, respectively. A coordinate transform 174 coupled to analog-to-digital converters 170 and 172 converts the digital in-phase and quadrature outputs into polar phase and amplitude representations 176 and 178 thereof (block 246). Amplitude information 178 is provided to the automatic gain control loop for comparison with the desired level and filtering (FIG. 10, block 312).

Phase information 176 is provided to modulator phase-locked loop filter 140, the output of which is then summed with the feed-forward modulation signal from multiplier 136. Phase information 176 is also provided to a backward difference circuit or input-previous circuit 180 to obtain frequency information. Input-previous block provides a difference between the current phase information and a previous phase information. The measured feedback frequency from backward difference circuit 180 is then provided to the deviation calibration loop, which compares the filtered frequency modulation input signal mean square value with the measured frequency deviation mean square value (FIG. 9, block 296). The comparison output is then supplied to a integrator 218 (FIG. 5 and FIG. 11, block 328), which generates deviation control signal 138 (blocks 298 and 330). The deviation control signal is provided to multiplier 136 and is multiplied thereby with the filtered frequency modulation input signal (block 300) to generate the modulation control signal (FIG. 6, block 236).

Note that wideband frequency modulator 130 may be divided into a digital portion 182 and the same RF/analog portion 68 as that of narrowband PM/FM modulator 10 shown in FIG. 1 and wideband phase modulator 70 shown in FIG. 2.

The embodiments of the present invention shown in FIGS. 1–11 use a voltage controlled oscillator and quadrature tuner feedback to address the problems of frequency translation, digital analog converter spurious and dynamic range, and high speed digital-to-analog converter drive circuitry complexity and power. In addition, all three embodiments include an identical RF/analog section 68. Therefore, implementation of the digital portions 66, 122, and 182 of these digital modulators with programmable logic devices would allow configuration of any of these modulators on a single platform.

Although several embodiments of the present invention and its advantages have been described in detail, it should be understood that mutations, changes, substitutions, transformations, modifications, variations, and alterations can be made therein without departing from the teachings of the present invention, the spirit and scope of the invention being set forth by the appended claims.

What is claimed is:

1. Apparatus for phase/frequency digital modulation, comprising:

a digital circuit receiving and processing a digital modulation input signal to generate a digital modulation control signal;

a digital-to-analog converter coupled to the digital circuit for converting the digital modulation control signal into an analog modulation control signal; and an RF/analog circuit coupled to the digital-to-analog converter, the RF/analog circuit comprising:
a voltage controlled oscillator generating a modulated output signal in response to the analog modulation control signal;
a quadrature tuner coupled to the voltage controlled oscillator generates an in-phase tuner output and a quadrature tuner output in response to the modulated output signal;
an analog-to-digital converter coupled to the quadrature tuner to convert the in-phase and quadrature tuner outputs to digital in-phase and quadrature tuner outputs, the digital in-phase and quadrature tuner outputs fed back to the digital circuit to generate the digital modulation control signal; and
a coordinate transformer coupled to the analog-to-digital converter for converting the in-phase and quadrature tuner outputs to a phase signal and an amplitude signal separately.

2. The apparatus, as set forth in claim 1, wherein the RF/analog circuit further comprises two filters coupled to the quadrature tuner to filter aliasing components from the in-phase and quadrature tuner outputs.

3. The apparatus, as set forth in claim 1, wherein the RF/analog circuit further comprises an automatic gain control amplifier coupled to the voltage controlled oscillator to maintain the power of the modulated output signal substantially at a predetermined level.

4. The apparatus, as set forth in claim 1, wherein the RF/analog circuit further comprises a lowpass filter coupled to the digital-to-analog converter for filtering aliasing components from the analog modulation control signal to generate a filtered analog modulation control signal provided to the voltage controlled oscillator.

5. The apparatus, as set forth in claim 1, wherein the digital circuit comprises:
  a phase accumulator receiving a digital frequency modulation input signal and converting the digital frequency modulation signal into a time varying phase signal;
  a first summer coupled to the phase accumulator for summing the time varying phase signal and a digital phase modulation input signal to generate a phase reference signal; and
  a second summer coupled to the first summer and the coordinate transformer and to subtract the phase signal from the phase reference signal; and
  a filter coupled to the second summer generating the digital modulation control signal supplied to the digital-to-analog converter.

6. Apparatus for phase/frequency digital modulation, comprising:
  a digital circuit receiving a modulation input signal and generating a modulation control signal;
  an RF/analog circuit coupled to the digital circuit and receiving the modulation control signal, the RF/analog circuit comprising:
    a voltage controlled oscillator generating a modulated output signal in response to the modulation control signal; and
    a quadrature tuner coupled to the voltage controlled oscillator to generate an in-phase tuner output and a quadrature tuner output in response to the modulation control signal;
  a coordinate transformer coupled to the quadrature tuner to convert the in-phase and quadrature tuner outputs to a phase signal as a feedback signal and an amplitude signal for automatic gain control; and
  an automatic gain control amplifier responsive to the amplitude signal and coupled to the output of the voltage controlled oscillator to maintain the power level of the modulated output signal substantially constant.

7. The apparatus, as set forth in claim 6, wherein the RF/analog circuit further comprises two filters coupled to the quadrature tuner to filter aliasing components from the in-phase and quadrature tuner outputs.

8. The apparatus, as set forth in claim 6, wherein the RF/analog circuit further comprises a lowpass filter coupled to the programmable logic digital circuit to filter aliasing components from the modulation control signal to generate a filtered modulation control signal coupled to the voltage controlled oscillator.

9. Apparatus for phase/frequency digital modulation, comprising:
  a digital circuit receiving a modulation input signal and generating a modulation control signal;
  an RF/analog circuit coupled to the digital circuit and receiving the modulation control signal, the RF/analog circuit comprising:
    a voltage controlled oscillator generating a modulated output signal in response to the modulation control signal; and
    a quadrature tuner coupled to the voltage controlled oscillator to generate an in-phase tuner output and a quadrature tuner output in response to the modulation control signal;
  a coordinate transformer coupled to the quadrature tuner to convert the in-phase and quadrature tuner outputs to a phase signal and an amplitude signal; and
  wherein the digital circuit comprises:
    a phase accumulator receiving a frequency modulation input signal and converting the frequency modulation signal into a time-varying phase signal;
    a first summer coupled to the phase accumulator to receive and sum the time varying phase signal and a phase modulation input signal to generate a phase reference signal; and
    a second summer coupled to the first summer and the coordinate transformer to subtract the phase signal from the phase reference signal and generating the modulation control signal supplied to the voltage controlled oscillator.

10. Apparatus for phase/frequency digital modulation, comprising:
  a digital circuit receiving a modulation input signal and generating a modulation control signal;
  an RF/analog circuit coupled to the digital circuit and receiving the modulation control signal, the RF/analog circuit comprising:
    a voltage controlled oscillator generating a modulated output signal in response to the modulation control signal; and
    a quadrature tuner coupled to the voltage controlled oscillator to generate an in-phase tuner output and a quadrature tuner output in response to the modulation control signal;
  a coordinate transformer coupled to the quadrature tuner to convert the in-phase and quadrature tuner outputs to a phase signal and an amplitude signal;
  an automatic gain control amplifier coupled to the output of the voltage controlled oscillator to maintain the power level of the modulated output signal substantially constant; and
  an automatic gain control loop coupled to the coordinate transformer to compare the amplitude signal output with a reference signal and generate a result signal to drive the automatic gain control amplifier.

11. Apparatus for phase/frequency digital modulation, comprising:
  a digital circuit receiving a modulation input signal and generating a modulation control signal;
  an RF/analog circuit coupled to the digital circuit and receiving the modulation control signal, the RF/analog circuit comprising:
    a voltage controlled oscillator generating a modulated output signal in response to the modulation control signal; and
    a quadrature tuner coupled to the voltage controlled oscillator to generate an in-phase tuner output and a quadrature tuner output in response to the modulation control signal;
  a coordinate transformer coupled to the quadrature tuner to convert the in-phase and quadrature tuner outputs to a phase signal and an amplitude signal; and
  wherein the digital circuit comprises:
    a deviation calibration loop receiving a phase modulation input signal and the phase signal from the coordinate transformer to compare the phase modulation input signal and the phase signal to generate a deviation control output;
    a multiplier coupled to the deviation calibration loop to multiply the phase modulation input signal by the deviation control output to generate a multiplier output; and
    a summer coupled to the multiplier and the coordinate transformer to receive and sum the multiplier output and the phase signal to generate the modulation control signal.

12. The apparatus, as set forth in claim 11, wherein the programmable logic digital circuit further comprises a bandpass filter receiving the phase modulation input signal and generating a filtered phase modulation input signal supplied to the deviation calibration loop and the multiplier.

13. The apparatus, as set forth in claim 11, wherein the programmable logic digital circuit further comprises a finite impulse response differentiator coupled to the output of the multiplier to generate a differentiated multiplier output supplied to the summer.

14. The apparatus, as set forth in claim 11, wherein the programmable logic digital circuit further comprises a filter coupled to the coordinate transformer to receive the phase signal and generate a filtered phase signal supplied to the summer.

15. The apparatus, as set forth in claim 11, wherein the deviation calibration loop comprises:
    a first squarer receiving the filtered phase modulation input signal from the bandpass filter to generate a squared phase modulation input signal;
    a second squarer receiving the phase signal from the coordinate transformer to generate a squared phase signal;
    a second summer coupled to the first and second squarers to receive and compare the squared phase signal and the squared phase modulation input signal to generate a comparison signal; and
    a deviation loop filter coupled to the second summer to generate the deviation output.

16. Apparatus for phase/frequency digital modulation, comprising:
    a digital circuit receiving a modulation input signal and generating a modulation control signal;
    an RF/analog circuit coupled to the digital circuit and receiving the modulation control signal, the RF/analog circuit comprising:
        a voltage controlled oscillator generating a modulated output signal in response to the modulation control signal; and
        a quadrature tuner coupled to the voltage controlled oscillator to generate an in-phase tuner output and a quadrature tuner output in response to the modulation control signal;
    a coordinate transformer coupled to the quadrature tuner to convert the in-phase and quadrature tuner outputs to a phase signal and an amplitude signal; and
    wherein the digital circuit comprises:
        a backward difference circuit coupled to the coordinate transformer to generate a frequency signal in response to the phase signal;
        a deviation calibration loop receiving a digital frequency modulation input signal and the frequency signal and generating a deviation output;
        a multiplier coupled to the deviation calibration loop to multiply the frequency modulation input signal by the deviation output to generate a multiplier output; and
        a summer coupled to the multiplier and the coordinate transformer to receive and sum the multiplier output and the phase signal to generate the modulation control signal applied to the voltage controlled oscillator.

17. The apparatus, as set forth in claim 16, wherein the programmable logic digital circuit further comprises a highpass filter receiving the digital frequency modulation input signal to generate a filtered frequency modulation input signal supplied to the deviation calibration loop and the multiplier.

18. The apparatus, as set forth in claim 16, wherein the programmable logic digital circuit further comprises a filter coupled to the coordinate transformer to receive the phase signal and generate a filtered phase signal supplied to the summer.

19. The apparatus, as set forth in claim 16, wherein the deviation calibration loop comprises:
    a first squarer receiving the filtered frequency modulation input signal from the highpass filter and generating a squared frequency modulation input signal;
    a second squarer receiving the frequency signal from the backward difference circuit to generate a squared frequency signal;
    a second summer coupled to the first and second squarers to receive and compare the squared frequency signal and the squared frequency modulation input signal to generate a comparison signal; and
    a deviation loop filter coupled to the second summer to generate the deviation output.

20. A method for phase/frequency digital modulation, comprising:
    receiving a modulation input signal and at least one feedback signal and generating a modulation control signal;
    controlling a voltage controlled oscillator in response to the modulation control signal and generating a modulated output signal;
    generating an in-phase output and a quadrature output in response to the modulated output signal;
    generating a phase feedback signal and an amplitude feedback signal from the in-phase output and the quadrature output;
    transforming the coordinates of the in-phase output and the quadrature output into a phase signal as a feedback signal and an amplitude signal for automatic gain control; and
    in response to the amplitude signal, maintaining the power level of the modulated output signal substantially constant.

21. The method, as set forth in claim 20, further comprising filtering aliasing components from the in-phase tuner output and quadrature tuner output.

22. The method, as set forth in claim 20, wherein receiving a modulation input signal further comprises:
    converting the frequency modulation input signal into a time varying phase signal;
    summing the time varying phase signal and a digital phase modulation input signal and generating a phase reference signal; and
    subtracting the phase signal from the phase reference signal and generating the modulation control signal.

23. The method, as set forth in claim 20, further comprising removing aliasing components from the modulation control signal and generating a filtered modulation control signal to generate the modulated output signal.

24. The method, as set forth in claim 20, further comprising:
    comparing the amplitude signal with a reference signal and generating a result signal; and
    controlling the power level of the modulated output signal substantially constant in response to the result signal.

25. A method for phase/frequency digital modulation, comprising:
receiving a modulation input signal and at least one feedback signal and generating a modulation control signal;
controlling a voltage controlled oscillator in response to the modulation control signal and generating a modulated output signal;
generating an in-phase output and a quadrature output in response to the modulated output signal;
generating a phase feedback signal and an amplitude feedback signal from the in-phase output and the quadrature output;
comparing a phase modulation input signal and the phase feedback signal and generating a deviation output;
multiplying the phase modulation input signal by the deviation output and generating a multiplier output;
differentiating the multiplier output and generating a differentiated multiplier output; and
summing the differentiated multiplier output and the phase feedback signal and generating the modulation control signal.

26. The method, as set forth in claim 25, further comprising:
bandpass filtering the phase modulation input signal and generating a filtered phase modulation input signal; and
generating the deviation output in response to the filtered phase modulation input signal.

27. The method, as set forth in claim 26, further comprising:
squaring the filtered phase modulation input signal and generating a squared phase modulation input signal;
squaring the phase signal and generating a squared phase signal;
summing the squared phase signal and the squared phase modulation input signal to generate a comparison signal; and
filtering the comparison signal and generating the deviation output in response thereto.

28. The method, as set forth in claim 25, summing further comprising filtering the phase signal and generating a filtered phase signal to be summed with the differentiated multiplier output to generate the modulation control signal.

29. The method, as set forth in claim 25, further comprising:
generating a frequency signal from the phase signal;
comparing a frequency modulation input signal and the frequency signal to generate a deviation output;
multiplying the frequency modulation input signal by the deviation output to generate a multiplier output; and
summing the multiplier output and the phase signal to generate the modulation control signal.

30. The method, as set forth in claim 29, further comprising highpass filtering the frequency modulation input signal and generating a filtered frequency modulation input signal.

31. The method, as set forth in claim 29, further comprising filtering the phase signal and generate a filtered phase signal to be summed with the multiplier output to generate the modulation control signal.

32. The method, as set forth in claim 29, further comprising:
squaring the filtered frequency modulation input signal and generating a squared frequency modulation input signal;
squaring the frequency signal and generating a squared frequency signal;
summing the squared frequency signal and the squared frequency modulation input signal and generating a comparison signal thereof; and
filtering the comparison signal and generating the deviation output.

33. Apparatus for phase/frequency digital modulation, comprising:
a digital circuit receiving and processing a digital modulation input signal to generate a digital modulation control signal;
a digital-to-analog converter coupled to the digital circuit for converting the digital modulation control signal into an analog modulation control signal;
an RF/analog circuit coupled to the digital-to-analog converter, the RF/analog circuit comprising:
a voltage controlled oscillator generating a modulated output signal in response to the analog modulation control signal;
a quadrature tuner coupled to the voltage controlled oscillator to generate an in-phase tuner output and a quadrature tuner output in response to the modulated output signal;
an analog-to-digital converter coupled to the quadrature tuner to convert the in-phase and quadrature tuner outputs to digital in-phase and quadrature tuner outputs, the digital in-phase and quadrature tuner outputs fed back to the digital circuit to generate the digital modulation control signal;
a coordinate transformer coupled to the analog-to-digital converter for converting the in-phase and quadrature tuner outputs to a phase signal and an amplitude signal;
an automatic gain control amplifier coupled to the output of the voltage controlled oscillator to maintain the power level of the modulated output signal substantially constant; and
an automatic gain control loop coupled to the coordinate transformer to compare the amplitude signal with a reference signal and generate a result signal to drive the automatic gain control amplifier.

34. Apparatus for phase/frequency digital modulation, comprising:
a digital circuit receiving and processing a digital modulation input signal to generate a digital modulation control signal;
a digital-to-analog converter coupled to the digital circuit for converting the digital modulation control signal into an analog modulation control signal;
an RF/analog circuit coupled to the digital-to-analog converter, the RF/analog circuit comprising:
a voltage controlled oscillator generating a modulated output signal in response to the analog modulation control signal;
a quadrature tuner coupled to the voltage controlled oscillator to generate an in-phase tuner output and a quadrature tuner output in response to the modulated output signal;
an analog-to-digital converter coupled to the quadrature tuner to convert the in-phase and quadrature tuner outputs to digital in-phase and quadrature tuner outputs, the digital in-phase and quadrature tuner outputs fed back to the digital circuit to generate the digital modulation control signal; and
a coordinate transformer coupled to the analog-to-digital converter for converting the in-phase and quadrature tuner outputs to a phase signal and an amplitude signal;

wherein the digital circuit further comprises:
- a deviation calibration loop receiving a digital phase modulation input signal and the phase signal from the coordinate transformer to compare the digital phase modulation input signal and the phase signal to generate a deviation control output;
- a multiplier coupled to the deviation calibration loop to multiply the digital phase modulation input signal by the deviation control signal to generate a multiplier output; and
- a summer coupled to the multiplier and the coordinate transformer to receive and sum the multiplier output and the phase signal to generate the digital modulation control signal supplied to the digital-to-analog converter.

35. The apparatus, as set forth in claim 34, wherein the digital circuit further comprises a bandpass filter receiving the digital phase modulation input signal and generating a filtered digital phase modulation input signal supplied to the deviation calibration loop and the multiplier.

36. The apparatus, as set forth in claim 34, wherein the digital circuit further comprises a finite impulse response differentiator coupled to the output of the multiplier to generate a differentiated multiplier output supplied to the summer.

37. The apparatus, as set forth in claim 34, wherein the digital circuit further comprises a filter coupled to the coordinate transform to receive the phase signal therefrom and generate a filtered phase signal supplied to the summer.

38. The apparatus, as set forth in claim 37, wherein the deviation calibration loop comprises:
- a first squarer receiving the filtered digital phase modulation input signal from the bandpass filter and generating a squared phase modulation input signal;
- a second squarer receiving the phase signal from the coordinate transform to generate a squared phase signal;
- a second summer coupled to the first and second squarers to receive and compare the squared phase signal and the squared phase modulation input signal to generate a comparison signal; and
- a deviation loop filter coupled to the second summer to generate the deviation control output.

39. Apparatus for phase/frequency digital modulation, comprising:
- a digital circuit receiving and processing a digital modulation input signal to generate a digital modulation control signal;
- a digital-to-analog converter coupled to the digital circuit for converting the digital modulation control signal into an analog modulation control signal;
- an RF/analog circuit coupled to the digital-to-analog converter, the RF/analog circuit comprising:
  - a voltage controlled oscillator generating a modulated output signal in response to the analog modulation control signal;
  - a quadrature tuner coupled to the voltage controlled oscillator to generate an in-phase tuner output and a quadrature tuner output in response to the modulated output signal;
  - an analog-to-digital converter coupled to the quadrature tuner to convert the in-phase and quadrature tuner outputs to digital in-phase and quadrature tuner outputs, the digital in-phase and quadrature tuner outputs fed back to the digital circuit to generate the digital modulation control signal; and
- a coordinate transformer coupled to the analog-to-digital converter for converting the digital in-phase and quadrature tuner outputs to a phase signal and an amplitude signal;

wherein the digital circuit comprises:
- a backward difference circuit coupled to the coordinate transformer and generating a frequency signal from the phase signal;
- a deviation calibration loop receiving and comparing a digital frequency modulation input signal and the frequency signal to generate a deviation output in response thereto;
- a multiplier coupled to the deviation calibration loop to multiply the digital frequency modulation input signal by the deviation output to generate a multiplier output; and
- a summer coupled to the multiplier and the coordinate transformer to receive and sum the multiplier output and the phase signal to generate the digital modulation control signal applied to the digital-to-analog converter.

40. The apparatus, as set forth in claim 39, wherein the digital circuit further comprises a highpass filter receiving the digital frequency modulation input signal to generate a filtered digital frequency modulation input signal supplied to the deviation calibration loop.

41. The apparatus, as set forth in claim 40, wherein the deviation calibration loop comprises:
- a first squarer receiving the filtered digital frequency modulation input signal from the highpass filter and generating a squared frequency modulation input signal;
- a second squarer receiving the frequency signal from the backward difference circuit to generate a squared frequency signal;
- a second summer coupled to the first and second squarers to receive and compare the squared frequency signal and the squared frequency modulation input signal to generate a comparison signal; and
- a filter coupled to the second summer to generate the deviation control output.

42. The apparatus, as set forth in claim 39, wherein the digital circuit further comprises a filter coupled to the coordinate transformer to receive the phase signal therefrom and generate a filtered phase signal supplied to the summer.

* * * * *